(12) United States Patent
Morita et al.

(10) Patent No.: US 11,581,470 B2
(45) Date of Patent: Feb. 14, 2023

(54) MANUFACTURING METHOD OF THERMOELECTRIC CONVERSION ELEMENT

(71) Applicant: LINTEC CORPORATION, Itabashi-ku (JP)

(72) Inventors: Wataru Morita, Saitama (JP); Kunihisa Kato, Warabi (JP); Tsuyoshi Muto, Saitama (JP); Yuma Katsuta, Gyoda (JP)

(73) Assignee: LINTEC CORPORATION, Itabashi-ku (JP)

( * ) Notice: Subject to any disclaimer, the term of this patent is extended or adjusted under 35 U.S.C. 154(b) by 50 days.

(21) Appl. No.: 17/271,057

(22) PCT Filed: Aug. 27, 2019

(86) PCT No.: PCT/JP2019/033406
§ 371 (c)(1),
(2) Date: Feb. 24, 2021

(87) PCT Pub. No.: WO2020/045377
PCT Pub. Date: Mar. 5, 2020

(65) Prior Publication Data
US 2021/0328124 A1    Oct. 21, 2021

(30) Foreign Application Priority Data
Aug. 28, 2018   (JP) .............................. JP2018-159286

(51) Int. Cl.
*H01L 35/34* (2006.01)
*H01L 35/16* (2006.01)

(52) U.S. Cl.
CPC .............. *H01L 35/34* (2013.01); *H01L 35/16* (2013.01)

(58) Field of Classification Search
CPC ................................ H01L 35/34; H01L 35/16
See application file for complete search history.

(56) References Cited

U.S. PATENT DOCUMENTS 6,127,619 A * 10/2000 Xi ........................... H01L 35/16
136/201
2003/0041892 A1   3/2003 Fleurial et al.
(Continued)

FOREIGN PATENT DOCUMENTS

JP    2013-251333 A   12/2013
JP    2017-41540 A    2/2017
(Continued)

OTHER PUBLICATIONS

Kim, KR-101292591-B1, Machine Translation (Year: 2013).*
International Search Report dated Nov. 19, 2019 in PCT/JP2019/033406 filed on Aug. 27, 2019, 2 pages.

*Primary Examiner* — Devina Pillay
(74) *Attorney, Agent, or Firm* — Oblon, McClelland, Maier & Neustadt, L.L.P.

(57) ABSTRACT

The present invention is to provide a method of producing a thermoelectric conversion device having a thermoelectric element layer with excellent shape controllability and capable of being highly integrated. The present invention relates to a method of producing a thermoelectric conversion device including a thermoelectric element layer formed of a thermoelectric semiconductor composition containing a thermoelectric semiconductor material on a substrate, the method including a step of providing a pattern frame having openings on a substrate; a step of filling the thermoelectric semiconductor composition in the openings; a step of drying the thermoelectric semiconductor composition filled in the openings, to form a thermoelectric element layer; and a step of releasing the pattern frame from the substrate.

20 Claims, 2 Drawing Sheets

(56) References Cited

U.S. PATENT DOCUMENTS

| | | | | |
|---|---|---|---|---|
| 2012/0060887 A1* | 3/2012 | Kim | ............... | H01L 35/34 |
| | | | | 136/224 |
| 2016/0194452 A1* | 7/2016 | Sandmeyer | ............ | C08G 77/04 |
| | | | | 528/31 |
| 2018/0366632 A1* | 12/2018 | Kanazawa | ............. | H01L 35/34 |
| 2019/0304809 A1* | 10/2019 | Raorane | ................ | H01L 24/32 |

FOREIGN PATENT DOCUMENTS

KR 101292591 B1 * 8/2013
WO WO 2016/104615 A1 6/2016

* cited by examiner

MANUFACTURING METHOD OF THERMOELECTRIC CONVERSION ELEMENT

TECHNICAL FIELD

The present invention relates to a method of producing a thermoelectric conversion device.

BACKGROUND ART

As one of effective usage means of energy, there have hitherto been devices for undergoing direction interconversion between thermal energy and electric energy due to thermoelectric conversion module having a thermoelectric effect, such as the Seebeck effect and the Peltier effect.

Above all, use of a so-called π-type thermoelectric conversion device is known as the thermoelectric conversion device. The π-type is typically constituted in a manner that a pair of electrodes spaced apart from each other is provided on a substrate, and for example, a P-type thermoelectric element is provided on one of the electrodes, and an N-type thermoelectric element is provided on the other electrode, such that the elements are similarly spaced apart from each other, and the upper surfaces of the both thermoelectric elements are joined to an electrodes of an opposing substrate. In addition, use of a so-called in-plane type thermoelectric conversion device is known. The in-plane type is typically constituted in a manner that plural thermoelectric elements are arranged such that an N-type thermoelectric element and a P-type thermoelectric element are alternately disposed, and for example, lower electrodes of the thermoelectric elements are joined in series.

In recent years, there has been a demand for an improvement in thermoelectric performance including a reduction in thickness and high integration of thermoelectric conversion devices. PTL 1 discloses a method of forming a pattern of a thermoelectric element layer directly by the screen printing method or the like by using a thermoelectric semiconductor composition containing a resin and the like, including the viewpoint of thinning by film thinning, as a thermoelectric element layer.

CITATION LIST

Patent Literature

PTL 1: WO 2016/104615 A

SUMMARY OF INVENTION

Technical Problem

However, in a method of forming a thermoelectric element as a pattern layer directly on an electrode or a substrate by the screen printing method or the like by using a thermoelectric semiconductor composition composed of a thermoelectric semiconductor material, a heat-resistant resin, and so on as disclosed in Patent Document 1, the shape controllability of the obtained thermoelectric element layer is not sufficient, and bleeding occurs at the end of the thermoelectric element layer on the electrode interface or the substrate interface, or the shape of the thermoelectric element layer collapses, and the desired shape can not be controlled. For example, in the case of constituting the aforementioned π-type thermoelectric conversion device, sufficient electrical and physical bondability may not be occasionally obtained between the upper surface of the obtained thermoelectric element layer and the electrode surface on the counter substrate. In this case, it becomes impossible to thoroughly bring out a thermoelectric performance which the thermoelectric element layer originally possesses due to an increase in heat resistance or the like, and in order to obtain a predetermined power generation performance or cooling performance, etc., the number of a P-type thermoelectric element layer-N-type thermoelectric element layer pair needs to be increased. Furthermore, on the occasion of highly integrating a π-type thermoelectric conversion device, scatting of the resistance value in each of the plural P-type thermoelectric element layer-N-type thermoelectric element layer pairs may occasionally become large, and the adjacent thermoelectric element layers may occasionally come into contact with each other.

Similarly, on the occasion of highly integrating the constitution of the aforementioned in-plane type thermoelectric conversion device, the end of the P-type thermoelectric element layer and the end of the N-type thermoelectric element layer enter each other, so that the interface may possibly become indistinct. In some cases, the resistance value of each of the plural P-type thermoelectric element layers-N-type thermoelectric element layer pairs varies, and a temperature difference in the respective joining parts between the adjacent P-type thermoelectric element layer and N-type thermoelectric element layer may be revealed, or an output thereof may possibly be scattered.

In view of the aforementioned problem, a problem of the present invention is to provide a method of producing a thermoelectric conversion device having a thermoelectric element layer with excellent shape controllability and capable of being highly integrated.

Solution to Problem

In order to solve the aforementioned circumstances, the present inventors made extensive and intensive investigations. As a result, they have found a method of producing a thermoelectric conversion device having a thermoelectric element layer with excellent shape controllability and capable of being highly integrated, by providing a pattern frame having openings spaced apart from each other on a substrate; filling a thermoelectric semiconductor composition containing a thermoelectric semiconductor material in the openings and drying it to form a thermoelectric element layer; and then releasing the pattern frame from the substrate, thereby leading to accomplishment of the present invention.

Specifically, the present invention provides the following (1) to (13).
(1) A method of producing a thermoelectric conversion device including a thermoelectric element layer formed of a thermoelectric semiconductor composition containing a thermoelectric semiconductor material on a substrate, the method including a step of providing a pattern frame having openings on a substrate; a step of filling the thermoelectric semiconductor composition in the openings; a step of drying the thermoelectric semiconductor composition filled in the openings, to form a thermoelectric element layer; and a step of releasing the pattern frame from the substrate.
(2) The method of producing a thermoelectric conversion device as set forth in the above (1), further including a step of subjecting the thermoelectric element layer to an annealing treatment.

(3) The method of producing a thermoelectric conversion device as set forth in the above (2), wherein the temperature of the annealing treatment is 250 to 600° C.
(4) The method of producing a thermoelectric conversion device as set forth in the above (2) or (3), including a step of releasing chips constituting the thermoelectric element layer after the annealing treatment.
(5) The method of producing a thermoelectric conversion device as set forth in any of the above (1) to (4), wherein the substrate is a polyimide film, a polyamide film, a polyether imide film, a polyaramid film, or a polyamide-imide film.
(6) The method of producing a thermoelectric conversion device as set forth in any of the above (1) to (5), wherein the pattern frame includes stainless steel, copper, aluminum, or iron.
(7) The method of producing a thermoelectric conversion device as set forth in any of the above (1) to (6), wherein the pattern frame includes a ferromagnetic body.
(8) The method of producing a thermoelectric conversion device as set forth in any of the above (1) to (7), wherein a release layer is included on the wall surface of the opening of the pattern frame.
(9) The method of producing a thermoelectric conversion device as set forth in any of the above (1) to (8), including a step of fixing the pattern frame on the substrate by using a magnet.
(10) The method of producing a thermoelectric conversion device as set forth in any of the above (1) to (9), wherein the thermoelectric semiconductor composition further contains a heat-resistant resin and an ionic liquid and/or an inorganic ionic compound.
(11) The method of producing a thermoelectric conversion device as set forth in any of the above (1) to (10), wherein the thermoelectric semiconductor material is a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material.
(12) The method of producing a thermoelectric conversion device as set forth in the above (10), wherein the heat-resistant resin is a polyimide resin, a polyamide resin, a polyamide-imide resin, or an epoxy resin.
(13) The method of producing a thermoelectric conversion device as set forth in any of the above (1) to (12), wherein the shape of the opening is at least one selected from the group consisting of an irregular shape, a polyhedral shape, a truncated cone shape, a truncated elliptical cone shape, a columnar shape, and an elliptic columnar shape.

Advantageous Effects of Invention

In accordance with the present invention, it is possible to provide a method of producing a thermoelectric conversion device having a thermoelectric element layer with excellent shape controllability and capable of being highly integrated.

DESCRIPTION OF EMBODIMENTS

[Production Method of Thermoelectric Conversion Device]

The method of producing a thermoelectric conversion device of the present invention is a method of producing a thermoelectric conversion device containing a thermoelectric element layer formed of a thermoelectric semiconductor composition containing a thermoelectric semiconductor material on a substrate, the method including a step of providing a pattern frame having openings on a substrate; a step of filling the thermoelectric semiconductor composition in the openings; a step of drying the thermoelectric semiconductor composition filled in the openings, to form a thermoelectric element layer; and a step of releasing the pattern frame from the substrate.

In the method of producing a thermoelectric conversion device of the present invention, a thermoelectric element layer with excellent shape controllability can be formed by providing a pattern frame having openings spaced apart from each other on a substrate; filling a thermoelectric semiconductor composition containing a thermoelectric semiconductor material in the openings and drying it; and then releasing the pattern frame from the substrate.

Preferably, the method of producing a thermoelectric conversion device of the present invention is adopted for constitutions of a π-type thermoelectric conversion device and an in-plane type thermoelectric conversion device.

In the constitution of the π-type thermoelectric conversion device, sufficient electrical and physical bondability is obtained between the upper surface of the obtained thermoelectric element layer and the electrode surface on the counter substrate, an increase in heat resistance or the like is suppressed, and a thermoelectric performance which the thermoelectric element layer originally possesses can be satisfactorily brought out. In addition to the above, in view of the fact that on the occasion of integrating the constitution of the π-type thermoelectric conversion device, the shape controllability is excellent, a scatting of the resistance value in each of the plural P-type thermoelectric element layer-N-type thermoelectric element layer pairs is suppressed, and the adjacent thermoelectric element layers do not come into contact with each other, and therefore, it becomes possible to achieve high integration.

On the occasion of integrating the constitution of the in-plane type thermoelectric conversion device, in view of the fact that the shape controllability is excellent, the end of the P-type thermoelectric element layer and the end of the N-type thermoelectric element layer, the both layers being disposed adjacent to each other, do not enter each other, so that the interface does not become indistinct. Thus, the scatting of the resistance value in each of the plural P-type thermoelectric element layer-N-type thermoelectric element layer pairs is suppressed, and revelation of the temperature difference in the respective joining parts between the adjacent P-type thermoelectric element layer and N-type thermoelectric element layer, the both layers being disposed adjacent to each other or an output thereof is stabilized, so that it becomes possible to achieve the high integration.

Meanwhile, even in the case where the obtained thermoelectric element layer is, for example, directly transferred into another substrate having electrodes to constitute a π-type thermoelectric conversion device or an in-plane type thermoelectric conversion device, and in the case where, for example, as for chips constituting the thermoelectric element layer, each of the chips is placed on the electrode of the substrate to constitute a π-type thermoelectric conversion device or an in-plane type thermoelectric conversion device, for example, the bondability to the electrode surface constituting the thermoelectric conversion device is improved, a lowering in the thermoelectric performance to be caused due to an increase of the heat resistance or the like is suppressed, and the thermoelectric performance which the thermoelectric element layer originally possesses is revealed. As a result, the number of thermoelectric element layers for obtaining a predetermined thermoelectric performance can be reduced, thereby leading to a reduction of manufacturing cost. At the same time, cooling leads to lower power consumption, and power generation leads to higher output. As for the integration, it becomes possible to achieve high integration in view of the fact that a thermoelectric element layer with excellent shape controllability is used.

As for the "opening" as referred to in this specification, a plural number thereof are provided spaced apart from each other in a region inside the entire region of the pattern frame as mentioned later. In the case where a planar shape of each aperture (in the case of viewing the pattern frame on the substrate from the upper surface side) is extended in the thickness (depth) direction of the pattern frame to the substrate surface, and for example, the planar shape of the aperture is a rectangle, though the shape of the opening differs depending upon the forming or processing method or the like of the pattern frame, the shape of the opening is typically an approximately rectangular parallelepiped shape. In addition, similarly, for example, in the case where the planar shape of the aperture is a circle, the shape of the opening typically has an approximately cylindrical shape. The shape of the opening of the pattern frame is not particularly restricted, and a desired shape can be used as mentioned later.

The method of producing a thermoelectric conversion device of the present invention is hereunder described with reference to the accompanying drawings.

Figure 1:
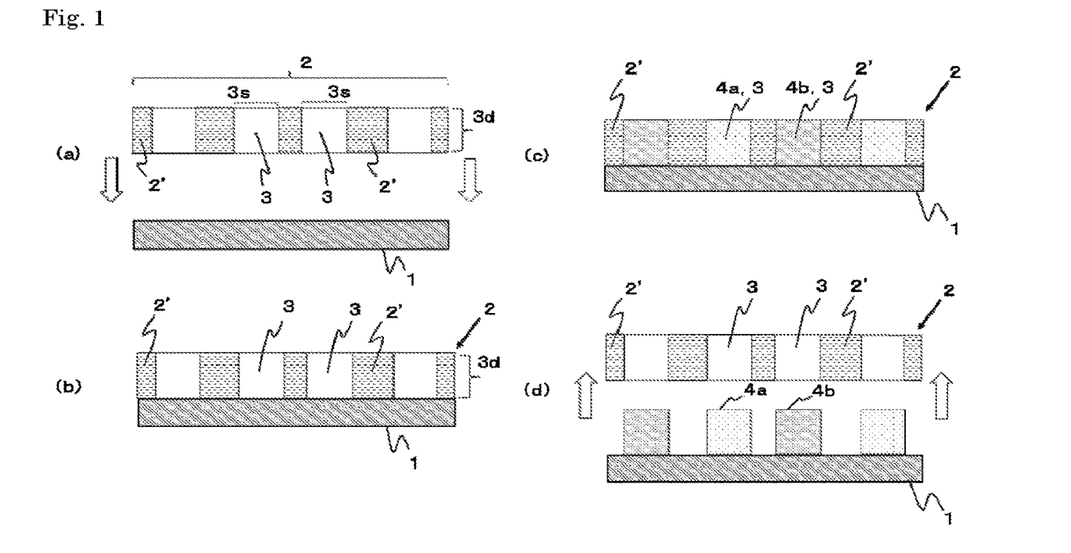
FIG. 1 is an explanatory view showing one example of steps according to the method of producing a thermoelectric conversion device of the present invention in order of steps.

FIG. 1 is an explanatory view showing one example of steps according to the method of producing a thermoelectric conversion device of the present invention in order of steps, in which (a) is a cross-sectional view showing an embodiment in which the pattern frame is opposed on the substrate; (b) is a cross-sectional view after the pattern frame is formed on the substrate; (c) is a cross-sectional view after filling the thermoelectric element layer in the openings of the pattern frame; and (d) is a cross-sectional view showing an embodiment in which the pattern frame is released from the filled thermoelectric element layer to obtain only the thermoelectric element layer.

Figure 3:
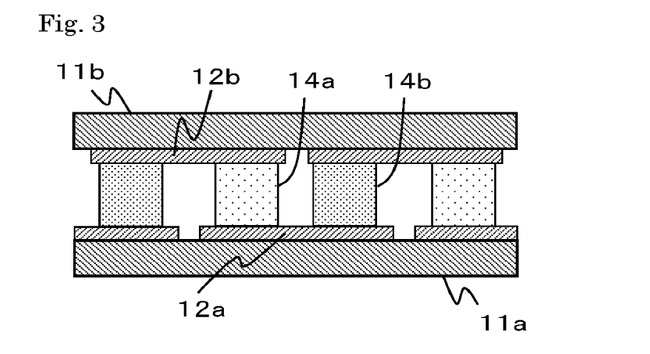
FIG. 3 is a cross-sectional view showing one example of a π-type thermoelectric conversion device obtained by the steps according to the method of producing a thermoelectric conversion device of the present invention.

FIG. 3 is a cross-sectional view showing one example of a π-type thermoelectric conversion device obtained by the steps according to the method of producing a thermoelectric conversion device of the present invention. An N-type thermoelectric element layer 14a and a P-type thermoelectric element layer 14b are formed by the same steps as those in FIGS. 1(b) to 1(d), except that in FIG. 1(a), an electrode 12a is provided on the substrate (on a substrate 11a in FIG. 3), and subsequently, the upper surfaces of the N-type thermoelectric element layer 14a and the P-type thermoelectric element layer 14b are joined to a counter electrode 12b on a counter substrate 1ib, whereby the π-type thermoelectric conversion device can be produced.

<Pattern Frame-Forming Step>

The pattern frame-forming step is a step of providing a pattern frame on a substrate. For example, the foregoing step is a step in which in FIG. 1(a), a pattern frame 2 formed of a stainless steel 2' as mentioned later and having apertures 3s and openings 3 and having an opening depth (pattern frame thickness) 3d and a substrate 1 are made opposite to each other; and in FIG. 1(b), the pattern frame 2 is provided on the substrate 1. In the present invention, though the pattern frame may be provided by being formed directly on the substrate, from the viewpoint of releasing the pattern frame from the substrate in a pattern frame-releasing step as mentioned later, typically, it is preferred that the pattern frame is provided in a manner that a previously formed pattern frame is placed and fixed on the substrate.

(Pattern Frame)

In the method of producing a thermoelectric conversion device of the present invention, a pattern frame having openings is provided on a substrate.

Figure 2:
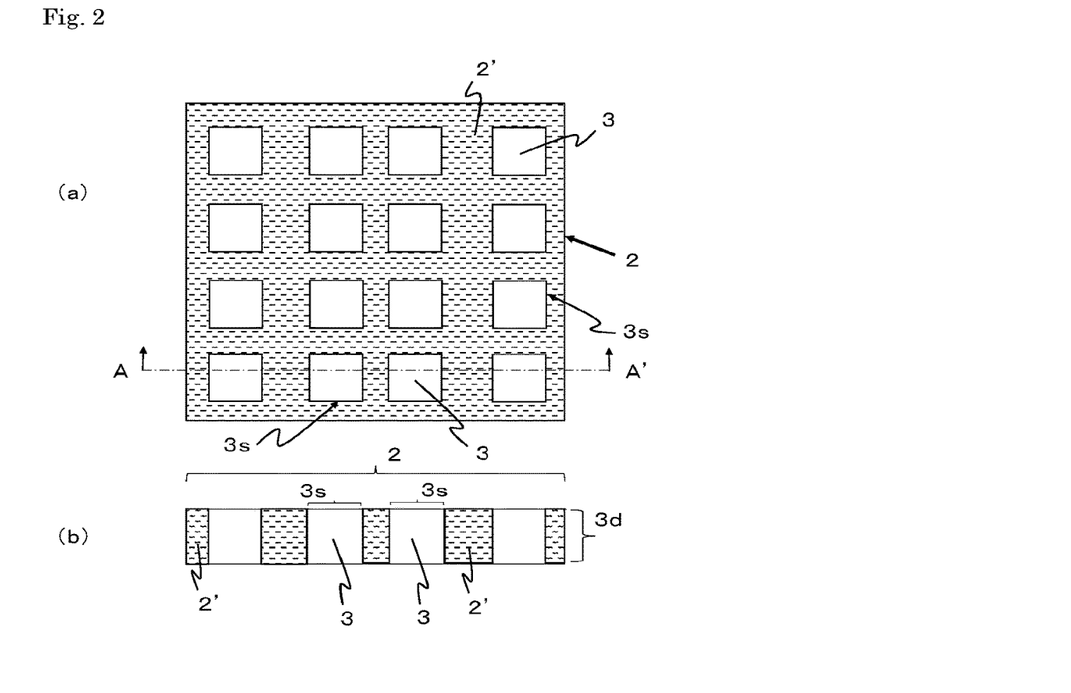
FIG. 2 is a constitution view for explaining one example of a pattern frame used for the method of producing a thermoelectric conversion device of the present invention.

FIG. 2 is a constitution view for explaining one example of a pattern frame used for the method of producing a thermoelectric conversion device of the present invention, in which (a) is a plan view of the pattern frame, and (b) is a cross-sectional view of the pattern frame when cut between A-A' in (a). The pattern frame 2 is formed of the stainless steel 2' and provided with the apertures 3s and the openings 3 having the opening depth (pattern frame thickness) 3d.

The disposition, the number, and the dimensions of the aforementioned apertures and openings included within the pattern frame are not particularly restricted inclusive of a distance between the openings, they are appropriately adjusted according to the shape and disposition of the thermoelectric element layer.

The shape of the opening is not particularly restricted, and a desired shape can be adopted. Preferably, the shape of the opening is at least one selected from the group consisting of an irregular shape, a polyhedral shape, a truncated cone shape, a truncated elliptical cone shape, a columnar shape, and an elliptic columnar shape. Examples of the polyhedral shape include a cubic shape, a rectangular parallelepiped shape, and a truncated pyramid shape. In view of the fact that formation or processing of the pattern frame is easy, a cubic shape, a rectangular parallelepiped shape, a truncated pyramid shape, and a columnar shape are more preferred. Of these, a cubic shape and a rectangular parallelepiped shape are still more preferred from the viewpoint of shape and thermoelectric performance of the thermoelectric element layer.

In FIG. 2, the aperture 3s is a square, the opening 3 is an approximately cubic shape (not illustrated), and 4×4 apertures and openings in total are present.

Examples of a material constituting the pattern frame include single metals, such as copper, silver, iron, nickel, chromium, and aluminum, and alloys, such as stainless steel and brass. Preferably, the material constituting the pattern frame includes stainless steel, copper, aluminum, or iron. Stainless steel and copper are more preferred from the viewpoint of easiness of formation of the pattern frame. The stainless steel is expressed as SUS (Steel Special Use Stainless) in JIS and defined as "an alloy steel composed mainly of iron and containing Cr or Ni for the purpose of improving corrosion resistance, in which generally, the C content is 1.2% or less, and the Cr content is 10.5% or more". Examples of the stainless steel include ferritic stainless steels (e.g., SUS430 Series according to the JIS standard) and austenitic stainless steels (e.g., SUS304 Series and SUS316 series according to the JIS standard).

It is also preferred that the pattern frame includes a ferromagnetic body. According to this, for example, in the case where a magnet is disposed on the surface of the substrate opposite to the pattern frame, the pattern frame can be easily fixed with the substrate interposed.

Examples of the ferromagnetic body include iron, nickel, cobalt, and alloys thereof, and ferritic stainless steels. In addition, alloys between at least one element selected from iron, nickel, cobalt, manganese, and chromium and at least one element selected from platinum, palladium, iridium, ruthenium, and rhodium can be used. The characteristics of the ferromagnetic body can be changed by changing the composition, a heat treatment, or the like. Of these, ferritic stainless steels are preferred from the viewpoint of versatility, fixing strength, easiness of attachment/detachment, damage to the substrate, and heat resistance. SUS430 is preferred as the ferritic stainless steel.

Although the magnet is not particularly restricted so long as position displacement of the pattern frame is not caused during production of the thermoelectric element layer, a permanent magnet or an electromagnet can be used. Examples of the permanent magnet include a ferrite magnet (component: $BaO.6Fe_2O_3$ and $SrO.6Fe_2O_3$, magnetic flux density: 0.4 $Wb/m^2$), a neodymium magnet (component: $Nd_2Fe_{14}B$, magnetic flux density: 1.2 $Wb/m^2$), a samarium magnet (component: $SmCo_5$, magnetic flux density: 1.2 $Wb/m^2$), a praseodymium magnet ($PrCo_5$), and a samarium-iron-nitrogen magnet. Of these, a ferrite magnet and a neodymium magnet are more preferred from the viewpoint of versatility, fixing strength, damage to the substrate, and heat resistance.

The pattern frame is formed from the aforementioned material. Although the method of forming the pattern frame is not particularly restricted, examples thereof include a method of previously subjecting the aforementioned material in a sheet-like shape to a predetermined known physical or chemical treatment mainly adopting the photolithography method or a combination thereof, to process it in a predetermined pattern shape. Examples thereof further include laser processing, electric discharge processing, milling processing, computer numerical control processing, water jet processing, and punching processing.

Alternatively, there is exemplified a method of subjecting a layer formed of the aforementioned material in which a pattern is not formed by a dry process, such as PVD (physical vapor deposition), e.g., vacuum evaporation, sputtering, or ion plating, or CVD (chemical vapor deposition), e.g., thermal CVD or atomic layer deposition (ALD); or a wet process, such as various coating methods, e.g., dip coating, spin coating, spray coating, gravure coating, or die coating, or a doctor blade method, or electrodeposition, a silver salt method, or the like, to a known physical or chemical treatment mainly adopting the aforementioned photolithography method or a combination thereof, to process it in a predetermined pattern shape.

In the present invention, from the viewpoint of process simplicity and pattern accuracy, a method in which the aforementioned material in a sheet-like shape is subjected to a known chemical treatment mainly adopting the photolithography method, for example, a patterning portion of a photoresist is subjected to a wet etching treatment, and the photoresist is removed to form a predetermined pattern, or laser processing is preferred.

Although the thickness of the pattern frame depends upon the thickness of the thermoelectric element layer and is appropriately adjusted, it is preferably 100 nm to 1,000 μm, more preferably 1 to 600 μm, still more preferably 10 to 400 μm, and especially preferably 10 to 300 μm. When the thickness of the pattern frame falls within this range, a pattern frame having an opening shape with excellent pattern accuracy is readily obtained.

(Release Layer)

It is preferred that a release layer is included on the wall surface of the opening of the pattern frame which is used in the present invention. The release layer has a function to easily release the formed thermoelectric element layer from the pattern frame.

In this specification, the "wall surface of the opening of the pattern frame" means the wall surface of the pattern frame constituting each of the openings provided in the pattern frame.

Although a release agent constituting the release layer is not particularly restricted, examples thereof include fluorine-based release agents (fluorine atom-containing compounds; for example, a fluorine oil and polytetrafluoroethylene), silicone-based release agents (silicone compounds; for example, a silicone oil, a silicone wax, a silicone resin, and a polyorganosiloxane having a polyoxyalkylene unit), wax-based release agents (waxes; for example, vegetable waxes, e.g., carnauba wax, animal waxes, e.g., wool wax, paraffins, e.g., paraffin wax, polyethylene wax, and polyethylene oxide wax), higher fatty acids or salts thereof (for example, a metal salt), higher fatty acid esters, higher fatty acid amides, and mineral oils.

Of these, fluorine-based release agents and silicone-based release agents are preferred from the viewpoint that not only the release after the formation of the thermoelectric element layer and after the annealing treatment becomes easy, but also the shape controllability of the thermoelectric element layer after the release is readily maintained, and fluorine-based release agents are more preferred from the viewpoint of release property.

The thickness of the release layer is preferably 10 nm to 5 μm, more preferably 50 nm to 1 μm, and still more preferably 100 nm to 0.5 μm. When the thickness of the release layer falls within this range, not only the release after the formation of the thermoelectric element layer and after the annealing treatment becomes easy, but also the shape controllability of the thermoelectric element layer after the release is readily maintained.

The formation of the release layer is performed using the aforementioned release agent. Examples of a method of forming the release layer include various coating methods, such as dip coating, spray coating, gravure coating, die coating, and doctor blade coating, relative to the pattern frame. The formation method is appropriately selected according to the shape of the pattern frame, physical properties of the release agent, or the like.

(Pattern Frame-Fixing Step)

It is preferred that the method of producing a thermoelectric conversion device includes a step of fixing the pattern frame including the aforementioned ferromagnetic body by using the aforementioned permanent magnet on the substrate.

The method of fixing the pattern frame can be performed by a known method. For example, the pattern frame including the ferromagnetic body is opposed to the permanent magnet and fixed with the substrate interposed. The permanent magnet is appropriately adjusted according to the pattern frame that is the ferromagnetic body, the kind of the substrate, and the thicknesses thereof, and the like.

(Substrate)

In the thermoelectric conversion device of the present invention, a resin film which neither lowers the electrical conductivity of the thermoelectric element layer nor affects the increase of the thermal conductivity is used as the substrate. Above all, a polyimide film, a polyamide film, a polyether imide film, a polyaramid film, and a polyamide-imide film are preferred from the standpoint that they are excellent in flexibility, and even in the case where a thin film of the thermoelectric element layer formed of a thermoelectric semiconductor composition is subjected to an annealing treatment, the performance of the thermoelectric element layer can be maintained without causing thermal deformation of the substrate, and the heat resistance and the dimensional stability are high; and furthermore, a polyimide film is especially preferred from the standpoint that it is high in versatility.

The thickness of the resin film is preferably 1 to 1,000 μm, more preferably 5 to 500 μm, and still more preferably 10 to 100 μm from the viewpoint of flexibility, heat resistance, and dimensional stability.

A 5% weight-reduction temperature of the resin film as measured by the thermogravimetric analysis is preferably 300° C. or higher, and more preferably 400° C. or higher. A dimensional change rate on heating as measured at 200° C. in conformity with JIS K7133 (1999) is preferably 0.5% or less, and more preferably 0.3% or less. A coefficient of linear expansion in the planar direction as measured in conformity with JIS K7197 (2012) is 0.1 ppm·° $C.^{-1}$ to 50 ppm·° $C.^{-1}$, and more preferably 0.1 ppm·° $C.^{-1}$ to 30 ppm·° $C.^{-1}$.

Examples of the substrate which is used in the present invention include a glass, silicon, a ceramic, and a metal from the viewpoint of performing the annealing treatment at a high temperature. A glass, silicon, or a ceramic is more preferably used from the viewpoint of material cost and dimensional stability after the heat treatment.

The thickness of the substrate is preferably 100 to 1,200 μm, more preferably 200 to 800 μm, and still more preferably 400 to 700 μm from the viewpoint of process and dimensional stability.

An electrode as mentioned later may be formed on the substrate inclusive of the resin film.

In the production method of the present invention, in the case of using the obtained thermoelectric element layer as a chip constituting the thermoelectric element layer as mentioned later, it is preferred to use a transfer base material as the substrate. By using the transfer base material, the obtained thermoelectric element layer can be collectively transferred as the chip constituting the thermoelectric element layer, for example, onto an electrode of another substrate.

Examples of the transfer base material include a glass, silicon, a ceramic, a metal, and a plastic, each having a sacrificial layer. A glass, silicon, a ceramic, or a metal is preferably used from the viewpoint of performing the annealing treatment at a high temperature, and a glass, silicon, or a ceramic is more preferably used from the viewpoint of adhesion to the sacrificial layer, material cost, and dimensional stability after the heat treatment.

The thickness of the transfer base material is preferably 100 to 1,200 μm, more preferably 200 to 800 μm, and still more preferably 400 to 700 μm from the viewpoint of process and dimensional stability.

The sacrificial layer is provided on the transfer base material and has a function to easily release the obtained thermoelectric element layer as a chip constituting the thermoelectric element layer from the transfer base material.

A resin or a release agent is preferred as the material constituting the sacrificial layer. Although the resin is not particularly restricted, a thermoplastic resin or a curable resin can be used. In addition, though the release agent constituting the sacrificial layer is not particularly restricted, examples thereof include fluorine-based release agents (fluorine atom-containing compounds; for example, polytetrafluoroethylene), silicone-based release agents (silicone compounds; for example, a silicone resin and a polyorganosiloxane having a polyoxyalkylene unit), higher fatty acids or salts thereof (for example, a metal salt), higher fatty acid esters, and higher fatty acid amides.

The thickness of the sacrificial layer is preferably 10 nm to 10 μm, more preferably 50 nm to 5 μm, and more preferably 200 nm to 2 μm. When the thickness of the sacrificial layer falls within this range, not only the release after the annealing treatment of the thermoelectric element layer becomes easy, but also the thermoelectric performance of the chip of the thermoelectric element layer after the release is readily maintained.

(Electrode-Forming Step)

The method of producing a thermoelectric conversion device of the present invention may include an electrode-forming step. The electrode-forming step is a step of forming an electrode on the substrate.

Examples of a metal material of the electrode of the thermoelectric conversion device include copper, gold, nickel, aluminum, rhodium, platinum, chromium, palladium, stainless steel, molybdenum, and tin, and alloys containing any of these metals.

The thickness of the layer of the electrode is preferably 10 nm to 200 μm, more preferably 30 nm to 150 μm, and still more preferably 50 nm to 120 μm. When the thickness of the layer of the electrode falls within the aforementioned range, the electrical conductivity is high, the resistance is low, and a sufficient strength as the electrode is obtained.

The formation of the electrode is performed using the aforementioned metal material.

Examples of a method of forming an electrode include a method in which after an electrode having no pattern formed thereon is provided on the substrate, the resultant is processed into a predetermined pattern shape by a known physical treatment or chemical treatment mainly adopting in the photolithography method, or a combination thereof; and a method in which a pattern of an electrode is directly formed by a screen printing method, an inkjet method, or the like.

Examples of the forming method of an electrode having no pattern formed thereon include dry processes, such as PVD (physical vapor deposition method), e.g., a vacuum evaporation method, a sputtering method, and an ion plating method, and CVD (chemical vapor deposition method), e.g., hot CVD and atomic layer deposition (ALD); wet processes, such as various coating methods, e.g., a dip coating method, a spin coating method, a spray coating method, a gravure coating method, a die coating method, and a doctor blade method, or electrodeposition method or the like; a silver salt method, an electroplating method, an electroless plating method, and lamination of a metal foil, and the forming method is properly selected according to the material of the electrode.

The electrode which is used in the present invention is required to have high electrical conductivity and high thermal conductivity from the viewpoint of maintaining the thermoelectric performance, and therefore, an electrode resulting from film formation by a plating method or a vacuum film formation method is preferably used. In view of the fact that high electrical conductivity and high thermal conductivity can be readily realized, a vacuum film formation method, such as a vacuum evaporation method and a sputtering method, an electroplating method, and an electroless plating method are preferred. The pattern can also be readily formed while interposing a hard mask, such as a metal mask, though it depends upon the required size and dimensional accuracy of the formed pattern.

<Thermoelectric Semiconductor Composition-Filling Step>

The thermoelectric semiconductor composition-filling step is a step of filling a thermoelectric semiconductor composition containing the aforementioned thermoelectric semiconductor material in the openings of the pattern frame on the substrate as obtained in the pattern frame-forming step, and for example, it is a step in which in FIG. 1(c), the thermoelectric semiconductor composition containing the P-type thermoelectric semiconductor material and the thermoelectric semiconductor composition containing the N-type thermoelectric semiconductor material are each filled in the predetermined openings 3 having the apertures 3s of the pattern frame 2 formed of the stainless steel 2' prepared in (b).

Examples of filling the thermoelectric semiconductor composition in the openings of the pattern layer include known methods, such as a screen printing method, a flexographic printing method, a gravure printing method, a spin coating method, a die coating method, a spray coating method, a bar coating method, a doctor blade method, and a dispense method. It is preferred to adopt a screen printing method, a stencil printing method, or a dispense method from the viewpoint of filling accuracy and production efficiency.

<Thermoelectric Element Layer-Forming Step>

The thermoelectric element layer-forming step is a step in which the thermoelectric semiconductor composition containing the thermoelectric semiconductor material filled in the thermoelectric semiconductor composition-filling step is dried to form a thermoelectric element layer. For example, it is a step in which in FIG. 1(c), the thermoelectric semiconductor composition containing the P-type thermoelectric semiconductor material and the thermoelectric semiconductor composition containing the N-type thermoelectric semiconductor material as filled in the openings 3 are dried to form a P-type thermoelectric element layer 4b and an N-type thermoelectric element layer 4a.

As the drying method, any conventionally known drying method, such as hot air drying, hot roll drying, and IR radiation, is employable. The heating temperature is typically 80 to 150° C., and though the heating time varies depending upon the heating method, it is typically a few seconds to several tens minutes. In the case where a solvent is used in preparing the thermoelectric semiconductor composition, the heating temperature is not particularly restricted so long as it falls within a range of temperature at which the used solvent can be dried.

(Thermoelectric Element Layer)

The thermoelectric element layer which is used in the present invention (hereinafter occasionally referred to as "thin film of the thermoelectric element layer") is formed of a thermoelectric semiconductor composition containing a thermoelectric semiconductor material. Preferably, the thermoelectric element layer is formed of a thermoelectric semiconductor composition containing a thermoelectric semiconductor material (hereinafter occasionally referred to as "thermoelectric semiconductor fine particles"), a heat-resistant resin, and an ionic liquid and/or an inorganic ionic compound.

(Thermoelectric Semiconductor Material)

The thermoelectric semiconductor material which is used in the present invention, namely the thermoelectric semiconductor material which is contained in the thermoelectric element layer is not particularly restricted so long as it is a material capable of generating a thermoelectromotive force by giving a temperature difference. Examples thereof include bismuth-tellurium-based thermoelectric semiconductor materials, such as P-type bismuth telluride and N-type bismuth telluride; telluride-based thermoelectric semiconductor materials, such as GeTe and PbTe; antimony-tellurium-based thermoelectric semiconductor materials; zinc-antimony-based thermoelectric semiconductor materials, such as ZnSb, $Zn_3Sb_2$, and $Zn_4Sb_3$; silicon-germanium-based thermoelectric semiconductor materials, such as SiGe; bismuth-selenide-based thermoelectric semiconductor materials, such as $Bi_2Se_3$; silicide-based thermoelectric semiconductor materials, such as $\beta$-$FeSi_2$, $CrSi_2$, $MnSi_{1.73}$, and $Mg_2Si$; oxide-based thermoelectric semiconductor materials; whistler materials, such as FeVAl, FeVAlSi, and FeVTiAl; and sulfide-based thermoelectric semiconductor materials, such as $TiS_2$.

Of these, bismuth-tellurium-based thermoelectric semiconductor materials, telluride-based thermoelectric semiconductor materials, antimony-tellurium-based thermoelectric semiconductor materials, or bismuth-selenide-based thermoelectric semiconductor materials are preferred.

Furthermore, a bismuth-tellurium-based thermoelectric semiconductor material, such as P-type bismuth telluride and N-type bismuth telluride, is more preferred from the viewpoint of the thermoelectric performance.

The P-type bismuth telluride is one in which the carrier is a hole, and the Seebeck coefficient is a positive value, and for example, one represented by $Bi_XTe_3Sb_{2-X}$ is preferably used. In this case, X is preferably $0<X\leq0.8$, and more preferably $0.4\leq X\leq0.6$. When X is more than 0 and 0.8 or less, the Seebeck coefficient and the electrical conductivity become large, and the characteristics as a P-type thermoelectric element are maintained, and hence, such is preferred.

The N-type bismuth telluride is one in which the carrier is an electron, and the Seebeck coefficient is a negative value, and for example, one represented by $Bi_2Te_{3-Y}Se_Y$ is preferably used. In this case, Y is preferably $0\leq Y\leq3$ (when Y=0, $Bi_2Te_3$), and more preferably $0<Y\leq2.7$. When Y is 0 or more and 3 or less, the Seebeck coefficient and the electrical conductivity become large, and the characteristics as an N-type thermoelectric element are maintained, and hence, such is preferred.

The thermoelectric semiconductor fine particles which are used for the thermoelectric semiconductor composition are those prepared by pulverizing the thermoelectric semiconductor material to a predetermined size by a pulverizer or the like.

The blending amount of the thermoelectric semiconductor fine particles in the thermoelectric semiconductor composition is preferably 30 to 99% by mass, more preferably 50 to 96% by mass, and still more preferably 70 to 95% by mass. When the blending amount of the thermoelectric semiconductor fine particles falls within the aforementioned range, the Seebeck coefficient (an absolute value of the Peltier coefficient) is large, a lowering of the electrical conductivity is suppressed, and only the thermal conductivity is lowered, and therefore, a film not only exhibiting a high thermoelectric performance but also having sufficient film strength and flexibility is obtained. Thus, such is preferred.

The average particle diameter of the thermoelectric semiconductor fine particles is preferably 10 nm or 200 μm, more preferably 10 nm to 30 μm, still more preferably 50 nm to 10 μm, and especially preferably 1 to 6 μm. When the average particle diameter of the thermoelectric semiconductor fine particles falls within the aforementioned range, the uniform dispersion becomes easy, and the electrical conductivity can be enhanced.

A method of pulverizing the thermoelectric semiconductor material to obtain thermoelectric semiconductor fine particles is not particularly limited, and the thermoelectric semiconductor material may be pulverized to a predetermined size by a known pulverizer, such as a jet mill, a ball mill, a beads mill, a colloid mill, and a roller mill.

The average particle diameter of the thermoelectric semiconductor fine particles is one obtained through measurement with a laser diffraction particle size analyzer (Mastersizer 3000, manufactured by Malvern Panalytical Ltd.), and a median value of the particle size distribution was taken.

The thermoelectric semiconductor fine particles are preferably those resulting from a heat treatment in advance (the "heat treatment" as referred to herein is different from the "annealing treatment" which is performed in the annealing treatment step as referred to in the present invention"). As for the thermoelectric semiconductor fine particles, by performing the annealing treatment, the crystallinity is improved, and furthermore, the surface oxide films of the thermoelectric semiconductor fine particles are removed, and therefore, the Seebeck coefficient or the Peltier coefficient of the thermoelectric conversion material increases, whereby a thermoelectric figure of merit can be more improved. Although the heat treatment is not particularly limited, the heat treatment is preferably performed in an inert gas atmosphere of nitrogen, argon, or the like, in which the gas flow rate is controlled, or in a reducing gas atmosphere of hydrogen or the like, in which the gas flow rate is similarly controlled, or under a vacuum condition, such that the thermoelectric semiconductor fine particles are not adversely affected before preparation of the thermoelectric semiconductor composition. The heat treatment is more preferably performed in a mixed gas atmosphere of an inert gas and a reducing gas. Though a specific temperature condition depends upon the thermoelectric semiconductor fine particles to be used, typically, it is preferred to perform the heat treatment at a temperature of not higher than the melting point of the fine particles and at 100 to 1,500° C. for several minutes to several tens hours.

(Heat-Resistant Resin)

In the thermoelectric semiconductor composition which is used in the present invention, a heat-resistant resin is preferably used from the viewpoint that after forming the thermoelectric element layer, the thermoelectric semiconductor material is subjected to an annealing treatment at a high temperature. The heat-resistant resin is one acting as a binder between the thermoelectric semiconductor materials (thermoelectric semiconductor fine particles) and capable of enhancing the flexibility of the thermoelectric conversion module and also making it easy to form a thin film by application or the like. Although the heat-resistant resin is not particularly restricted, a heat-resistant resin in which various physical properties as a resin, such as mechanical strength and thermal conductivity, are maintained without being impaired on the occasion of subjecting the thermoelectric semiconductor fine particles to crystal growth through an annealing treatment of a thin film formed of the thermoelectric semiconductor composition, or the like, is preferred.

As the heat-resistant resin, a polyamide resin, a polyamide-imide resin, a polyimide resin, and an epoxy resin are preferred from the standpoint that not only the heat resistance is higher, but also the crystal growth of the thermoelectric semiconductor fine particles in the thin film is not adversely affected; and a polyamide resin, a polyamide-imide resin, and a polyimide resin are more preferred from the standpoint that the flexibility is excellent. In the case where a polyimide film is used as a substrate as mentioned later, a polyimide resin is more preferred as the heat-resistant resin from the standpoint of adhesion to the polyimide film or the like. In the present invention, the polyimide resin is a generic term for a polyimide and a precursor thereof.

Preferably, the heat-resistant resin has a decomposition temperature of 300° C. or higher. When the decomposition temperature falls within the aforementioned range, even in the case of subjecting the thin film formed of the thermoelectric semiconductor composition to an annealing treatment as mentioned later, the flexibility can be maintained without losing the function as the binder.

As for the heat-resistant resin, its mass reduction rate at 300° C. by the thermogravimetry (TG) is preferably 10% or less, more preferably 5% or less, and still more preferably 1% or less. When the mass reduction rate falls within the aforementioned range, even in the case of subjecting the thin film formed of the thermoelectric semiconductor composition to an annealing treatment as mentioned later, the flexibility of the thermoelectric element layer can be maintained without losing the function as the binder.

The blending amount of the heat-resistant resin in the thermoelectric semiconductor composition is 0.1 to 40% by mass, preferably 0.5 to 20% by mass, more preferably 1 to 20% by mass, and still more preferably 2 to 15% by mass. When the blending amount of the heat-resistant resin falls within the aforementioned range, the heat-resistant resin functions as a binder of the thermoelectric semiconductor material, a thin film is readily formed, and a film in which both high thermoelectric performance and film strength are made compatible with each other is obtained.

(Ionic Liquid)

The ionic liquid which is used in the present invention is a molten salt composed of a combination of a cation and an anion and refers to a salt capable of existing as a liquid in any temperature region of −50 to 500° C. The ionic liquid has such characteristic features that it has an extremely low vapor pressure and is nonvolatile; it has excellent heat stability and electrochemical stability; its viscosity is low; and its ionic conductivity is high, and therefore, the ionic liquid is able to effectively suppress a reduction of the electrical conductivity between the thermoelectric semiconductor fine particles as an electrical conductive assistant. In addition, the ionic liquid exhibits high polarity based on the aprotic ionic structure thereof and is excellent in compatibility with a heat-resistant resin, and therefore, the ionic liquid can make the thermoelectric element layer have a uniform electrical conductivity.

As the ionic liquid, any known materials or commercially available products can be used. Examples thereof include those constituted of a cation component, such as a nitrogen-containing cyclic cation compound, e.g., pyridinium, pyrimidinium, pyrazolium, pyrrolidinium, piperidinium, and imidazolium, and a derivative thereof, a tetraalkylammonium type amine-based cation and a derivative thereof, a phosphine-based cation, e.g., phosphonium, a trialkylsulfonium, and a tetraalkylphosphonium, and a derivative thereof, and a lithium cation and a derivative thereof; and an anion component, such as a halide anion, for example, a chloride ion, e.g., $Cl^-$, $AlCl_4^-$, $Al_2Cl_7^-$, and $ClO_4^-$, a bromide ion, e.g., $Br^-$, an iodide ion, e.g., $I^-$, a fluoride ion, e.g., $BF_4^-$ and $PF_6^-$, and $F(HF)_n^-$, $NO_3^-$, $CH_3COO^-$, $CF_3COO^-$, $CH_3SO_3^-$, $CF_3SO_3^-$, $(FSO_2)_2N^-$, $(CF_3SO_2)_2N^-$, $(CF_3SO_2)_3C^-$, $AsF_6^-$, $SbF_6^-$, $NbF_6^-$, $TaF_6^-$, $F(HF)_n^-$, $(CN)_2N^-$, $C_4F_9SO_3^-$, $(C_2F_5SO_2)_2N^-$, $C_3F_7COO^-$, and $(CF_3SO_2)(CF_3CO)N^-$.

Among the aforementioned ionic liquids, it is preferred that the cation component of the ionic liquid contains at least one selected from a pyridinium cation and a derivative thereof, and an imidazolium cation and a derivative thereof, from the viewpoint of the high-temperature stability, the compatibility between the thermoelectric semiconductor fine particles and the resin, suppressing a lowering in the electrical conductivity between the thermoelectric semiconductor fine particles, and so on. It is preferred that the anionic component of the ionic liquid contains a halide anion, and it is more preferred that at least one selected from $Cl^-$, $Br^-$, and $I^-$ is contained.

Specific examples of the ionic liquid in which the cation component contains any of a pyridinium cation and a derivative thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butyl-4-methylpyridinium bromide, 1-butyl-4-methylpyridinium hexafluorophosphate, and 1-butyl-4-methylpyridinium iodide. Of these, 1-butyl-4-methylpyridinium bromide, 1-butyl-4-methylpyridinium hexafluorophosphate, and 1-butyl-4-methylpyridinium iodide are preferred.

Specific examples of the ionic liquid in which the cation component contains any of an imidazolium cation and a derivative thereof include [1-butyl-3-(2-hydroxyethyl)imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methyl sulfate, and 1,3-dibutylimidazolium methyl sulfate. Of these, [1-butyl-3-(2-hydroxyethyl)imidazolium bromide] and [1-butyl-3-(2-hydroxyethyl)imidazolium tetrafluoroborate] are preferred.

The aforementioned ionic liquid has an electrical conductivity of preferably $10^{-7}$ S/cm or more, and more preferably $10^{-6}$ S/cm or more. When the electrical conductivity falls within the aforementioned range, a reduction of the electrical conductivity between the thermoelectric semiconductor fine particles can be effectively suppressed as the electrical conductive assistant.

Preferably, the ionic liquid has a decomposition temperature of 300° C. or higher. When the decomposition temperature falls within the aforementioned range, even in the case of subjecting the thin film of the thermoelectric element layer formed of the thermoelectric semiconductor composition to an annealing treatment as mentioned later, the effect as the electrical conductive assistant can be maintained.

As for the ionic liquid, its mass reduction rate at 300° C. by the thermogravimetry (TG) is preferably 10% or less, more preferably 5% or less, and still more preferably 1% or less. When the mass reduction rate falls within the aforementioned range, even in the case of subjecting the thin film of the thermoelectric element layer formed of the thermoelectric semiconductor composition to an annealing treatment as mentioned later, the effect as the electrical conductive assistant can be maintained.

The blending amount of the ionic liquid in the thermoelectric semiconductor composition is preferably 0.01 to 50% by mass, more preferably 0.5 to 30% by mass, and still more preferably 1.0 to 20% by mass. When the blending amount of the ionic liquid falls within the aforementioned range, a lowering of the electrical conductivity is effectively suppressed, and a film having a high thermoelectric performance is obtained.

(Inorganic Ionic Compound)

The inorganic ionic compound which is used in the present invention is a compound constituted of at least a cation and an anion. The inorganic ionic compound is a solid at room temperature, has a melting point at any temperature in a temperature region of 400 to 900° C., and has such a characteristic feature that its ionic conductivity is high, and therefore, it is able to suppress a reduction of the electrical conductivity between the thermoelectric semiconductor fine particles as the electrical conductive assistant.

A metal cation is used as the cation.

Examples of the metal cation include an alkali metal cation, an alkaline earth metal cation, a typical metal cation, and a transition metal cation, with an alkali metal cation or an alkaline earth metal cation being preferred.

Examples of the alkali metal cation include $Li^+$, $Na^+$, $K^+$, $Rb^+$, $Cs^+$, and $Fr^+$.

Examples of the alkaline earth metal cation include $Mg^{2+}$, $Ca^{2+}$, $Sr^{2+}$, and $Ba^{2+}$.

Examples of the anion include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound, any known materials or commercially available products can be used. Examples thereof include those constituted of a cation component, such as a potassium cation, a sodium cation, and a lithium cation; and an anion component, such as a halide anion, for example, a chloride ion, e.g., $Cl^-$, $AlCl_4^-$, $Al_2Cl_7^-$, and $ClO_4^-$, a bromide ion, e.g., $Br^-$, an iodide ion, such as $I^-$, a fluoride ion, e.g., $BF_4^-$ and $PF_6^-$, and $F(HF)_n^-$, $NO_3^-$, $OH^-$, and $CN^-$.

Among the aforementioned inorganic ionic compounds, it is preferred that the cation component of the inorganic ionic compound contains at least one selected from potassium, sodium, and lithium from the viewpoint of the high-temperature stability, the compatibility between the thermoelectric semiconductor fine particles and the resin, suppressing a lowering of the electrical conductivity between the thermoelectric semiconductor fine particles, and so on. In addition, the anion component of the inorganic ionic compound contains preferably a halide anion, and more preferably contains at least one selected from $Cl^-$, $Br^-$, and $I^-$.

Specific examples of the inorganic ionic compound in which the cation component contains a potassium cation include KBr, KI, KCl, KF, KOH, and $K_2CO_3$. Of these, KBr and KI are preferred.

Specific examples of the inorganic ionic compound in which the cation component contains a sodium cation include NaBr, NaI, NaOH, NaF, and $Na_2CO_3$. Of these, NaBr and NaI are preferred.

Specific examples of the inorganic ionic compound in which the cation component contains a lithium cation include LiF, LiOH, and LiNO$_3$. Of these, LiF and LiOH are preferred.

The aforementioned inorganic ionic compound has an electrical conductivity of preferably $10^{-7}$ S/cm or more, and more preferably $10^{-6}$ S/cm or more. When the electrical conductivity falls within the aforementioned range, a reduction of the electrical conductivity between the thermoelectric semiconductor fine particles can be effectively suppressed as the electrical conductive assistant.

Preferably, the inorganic ionic compound has a decomposition temperature of 400° C. or higher. When the decomposition temperature falls within the aforementioned range, even in the case of subjecting the thin film of the thermoelectric element layer formed of the thermoelectric semiconductor composition to an annealing treatment as mentioned later, the effect as the electrical conductive assistant can be maintained.

As for the inorganic ionic compound, its mass reduction rate at 400° C. by the thermogravimetry (TG) is preferably 10% or less, more preferably 5% or less, and still more preferably 1% or less. When the mass reduction rate falls within the aforementioned range, even in the case of subjecting the thin film of the thermoelectric element layer formed of the thermoelectric semiconductor composition to an annealing treatment as mentioned later, the effect as the electrical conductive assistant can be maintained.

The blending amount of the inorganic ionic compound in the thermoelectric semiconductor composition is preferably 0.01 to 50% by mass, more preferably 0.5 to 30% by mass, and still more preferably 1.0 to 10% by mass. When the blending amount of the inorganic ionic compound falls within the aforementioned range, a lowering of the electrical conductivity can be effectively suppressed, and as a result, a film having an improved thermoelectric performance is obtained.

In the case of using a combination of the inorganic ionic compound and the ionic liquid, the total amount of contents of the inorganic ionic compound and the ionic liquid in the thermoelectric semiconductor composition is preferably 0.01 to 50% by mass, more preferably 0.5 to 30% by mass, and still more preferably 1.0 to 10% by mass.

(Other Additives)

The thermoelectric semiconductor composition which is used in the present invention may further contain, in addition to the aforementioned components, other additives, such as a dispersant, a film-forming assistant, a photostabilizer, an antioxidant, a tackifier, a plasticizer, a coloring agent, a resin stabilizer, a filler, a pigment, a conductive filler, a conductive polymer, and a curing agent, as the need arises. These additives can be used alone or in combination of two or more thereof.

(Preparation Method of Thermoelectric Semiconductor Composition)

The preparation method of a thermoelectric semiconductor composition which is used in the present invention is not particularly restricted, and the thermoelectric semiconductor composition may be prepared by adding the aforementioned thermoelectric semiconductor fine particles, the aforementioned heat-resistant resin, and the aforementioned ionic liquid and/or inorganic ionic compound, and optionally the aforementioned other additives and further a solvent, and mixing and dispersing them by a known method using an ultrasonic homogenizer, a spiral mixer, a planetary mixer, a disperser, a hybrid mixer, or the like.

Examples of the solvent include solvents, such as toluene, ethyl acetate, methyl ethyl ketone, an alcohol, tetrahydrofuran, methylpyrrolidone, and ethyl cellosolve. These solvents may be used alone or may be used in admixture of two or more thereof. The solid content concentration of the thermoelectric semiconductor composition is not particularly restricted so long as the composition has a viscosity suited for application.

The thin film of the thermoelectric element layer formed of the thermoelectric semiconductor composition can be formed by filling the thermoelectric semiconductor composition in the openings of the pattern frame used in the present invention and drying it. In this way, by forming the thermoelectric element layer, a thermoelectric element layer with excellent shape controllability in which the shapes of the openings of the pattern layer are reflected.

Although the thickness of the thin film of the thermoelectric element layer formed of the thermoelectric semiconductor composition is not particularly restricted, it is preferably 100 nm to 1,000 µm, more preferably 1 to 600 µm, still more preferably 10 to 400 µm, and especially preferably 10 to 300 µm from the standpoint of thermoelectric performance and film strength.

<Pattern Frame-Releasing Step>

The pattern frame-releasing step is a step of releasing only the pattern frame from the substrate relative to the pattern frame including the thermoelectric element layer formed in the thermoelectric element layer-forming step. For example, the foregoing step is a step in which in FIG. 1(d), as to the P-type thermoelectric element layer 4b and the N-type thermoelectric element layer 4a formed in the openings 3, the pattern frame 2 formed of the stainless steel 2' is released from the substrate 1, thereby allowing the P-type thermoelectric element layer 4b and the N-type thermoelectric element layer 4a to remain on the substrate 1.

The releasing method is not particularly restricted so long as on the occasion of releasing the pattern frame, not only the shape of the thermoelectric element layer is not impaired, or a damage or the like on the surface of the thermoelectric element layer is slight, but also the thermoelectric performance is not lowered, and it can be performed by a known method. In addition, the pattern frame-releasing step may be performed after an annealing step as mentioned later in the case where even after the annealing treatment step, the aforementioned requirements are satisfied after releasing.

(Annealing Treatment Step)

Preferably, the production method of the present invention includes a step of subjecting the thermoelectric element layer to an annealing treatment.

The annealing treatment step is a step in which in a step of drying the thermoelectric semiconductor composition, after drying the thermoelectric element layer, a heat treatment is further performed. By performing the annealing treatment, not only the thermoelectric performance can be stabilized, but also the thermoelectric semiconductor fine particles in the thermoelectric element layer (thin film) can be subjected to crystal growth, and the thermoelectric performance can be more improved.

Although the annealing treatment is not particularly limited, typically, it is performed in an inert gas atmosphere of nitrogen, argon, or the like, in which the gas flow rate is controlled, or in a reducing gas atmosphere, or under a vacuum condition. Although the temperature of the annealing treatment depends upon the heat-resistant resin, the ionic liquid, or the inorganic ionic compound to be used, or a heat resistance temperature or the like of the substrate, etc., in the case where the aforementioned substrate having high heat resistance, such as a glass, silicon, a ceramic, and a metal, is used as the substrate, the annealing treatment is performed typically at 250 to 650° C. for several minutes to several tens hours, and preferably at 250 to 600° C. for several minutes to several tens hours.

In the case where the aforementioned resin film, such as a polyimide film, a polyamide film, a polyether imide film, a polyaramid film, and a polyamide-imide film, is used as the substrate, the annealing treatment is performed typically at 100 to 450° C. for several minutes to several tens hours, preferably at 150 to 400° C. for several minutes to several tens hours, more preferably at 200 to 375° C. for several minutes to several tens hours, and still more preferably at 250 to 350° C. for several minutes to several tens hours.
(Thermoelectric Element Layer-Releasing Step)

The production method of the present invention may include a step of releasing chips constituting the thermoelectric element layer after the annealing treatment.

The thermoelectric element layer-releasing step is a step in which after subjecting the thermoelectric element layer to an annealing treatment, the thermoelectric element layer is released as chips constituting the thermoelectric element layer from the substrate.

In the thermoelectric element layer-releasing step, the method of releasing chips constituting the thermoelectric element layer from the substrate is not particularly restricted so long as it is a method in which the release can be performed, and the release is performed by a known method. The chips may be released directly from the substrate, or the chips constituting a plurality of the thermoelectric element layers may be collectively transferred onto another substrate or electrodes on another substrate by using the aforementioned substrate. The release can be appropriately adjusted according to the constitution of the thermoelectric conversion device.

The chips constituting the thermoelectric element layer have excellent shape controllability. Preferably, the chips constituting the thermoelectric element layer are formed connected via the electrodes so as to have a constitution to be used for a π-type or in-plane type thermoelectric conversion device from the viewpoint of improving the thermoelectric performance.

Here, in the case of constituting the π-type thermoelectric conversion device, for example, it is constituted in such a manner that a pair of electrodes spaced apart from each other is provided on a substrate; a chip constituting a P-type thermoelectric element layer is provided on one of the electrodes, whereas a chip constituting an N-type thermoelectric element layer is provided on the other electrode, while making the both chips similarly spaced apart from each other; and the upper surfaces of the chips constituting the both thermoelectric element layers are electrically connected in series to electrodes on an opposing substrate. From the viewpoint of efficiently obtaining a high thermoelectric performance, it is preferred that a plurality of pairs of a chip constituting the P-type thermoelectric element layer and a chip constituting the N-type thermoelectric element layer via the electrodes of the opposing substrates are electrically connected in series and used.

Similarly, in the case of constituting an in-plane type thermoelectric conversion device, for example, it is constituted in such a manner that one electrode is provided on a substrate; a chip constituting a P-type thermoelectric element layer is provided on the surface of the electrode, and similarly, a chip constituting an N-type thermoelectric element layer is provided on the surface of the electrode such that the side surfaces of the both chips (for example, the surfaces in a direction perpendicular to the substrate) are in contact with or spaced apart from each other; and the chips are electrically connected in series (including a pair of extraction electrodes) in the in-plane direction of the substrate via the electrode. From the viewpoint of efficiently obtaining a high thermoelectric performance, in this constitution, it is preferred that the chips constituting the same number of the plurality of P-type thermoelectric element layers and the chips constituting the N-type thermoelectric element layer are alternatively electrically connected in series in the in-plane direction of the substrate via the electrode and used.

In accordance with the method of producing a thermoelectric conversion device of the present invention, the shape controllability of the thermoelectric element layer can be improved by a simple method. The constitution of the thermoelectric conversion device is preferably a constitution which is used for the π-type or in-plane type thermoelectric conversion device. In any case, high integration of the thermoelectric conversion device can be realized.

[Thermoelectric Conversion Device]

The thermoelectric conversion device obtained by the production method of the present invention includes a thermoelectric element layer obtained in a method of producing a thermoelectric conversion device including a thermoelectric element layer composed of a thermoelectric semiconductor composition containing a thermoelectric semiconductor material on a substrate, the method including a step of providing a pattern frame having openings on the substrate, a step of filling the thermoelectric semiconductor composition in the openings, a step of drying the thermoelectric semiconductor composition filled in the openings to form a thermoelectric element layer, and a step of releasing the pattern frame from the substrate.

(Thermoelectric Element Layer)

As for the thermoelectric element layer of the thermoelectric conversion device obtained by the production method of the present invention, its upper surface is depressed in a concave form. In view of the fact that the thermoelectric element layer is formed in a manner that a thermoelectric semiconductor composition containing a thermoelectric semiconductor material is filled in the openings of the pattern frame, and subsequently, volatile components in the thermoelectric semiconductor composition are removed due to drying, the surface of the thermoelectric element layer corresponding to an aperture of the opening on the opposite side to the substrate side of the pattern frame is not flat but depressed in a concave form. For example, in FIG. 1($d$), the upper surface of each of the N-type thermoelectric element layer 4$a$ and the P-type thermoelectric element layer 4$b$ may possibly be depressed in a concave form.

The shape and dimensions of the concave depression are not constant because they depend on the viscosity of the thermoelectric semiconductor composition, volatile components, drying conditions, and the like, but typically, the concave depression is a depression of 1 to 30% relative to the thickness of the thermoelectric element layer.

The thermoelectric element layer of the thermoelectric conversion device obtained by the production method of the present invention may occasionally have a streaky scratch mark extending in a direction intersecting with the substrate on the side surface thereof. It may be estimated that in view of the fact that the thermoelectric element layer is formed by filling the openings of the pattern frame with a thermoelectric semiconductor composition containing a thermoelectric semiconductor material, subsequently drying to form a thermoelectric element layer, and then releasing the pattern frame from the substrate, on the occasion of releasing the pattern frame, the wall surface in the opening of the pattern frame and the side surface of the thermoelectric element layer cause a physical interaction, such as friction, on the interface therebetween due to release, and after releasing, a streaky scratch mark extending in a direction intersecting with the substrate is formed on the side surface of the thermoelectric element layer obtained on the substrate. For example, in FIG. 1(d), a streaky scratch mark extending in a direction intersecting with the substrate in any of the side surfaces of the N-type thermoelectric element layer 4a and the P-type thermoelectric element layer 4b is generated.

The length, width, number, etc. of the streaky scratch mark are not constant because they depend upon the surface hardness and surface roughness of the wall surface in the opening of the pattern frame and the release condition (e.g., release direction, release speed, etc.). However, typically, the length of the streaky scratch mark is 100 nm to 500 µm.

INDUSTRIAL APPLICABILITY

In accordance with the method of producing a thermoelectric conversion device of the present invention, a thermoelectric conversion device having a thermoelectric element layer with excellent shape controllability and capable of being highly integrated can be obtained through a simple production method. In addition, at the same time, since a scatting of the resistance value in each of the plural P-type thermoelectric element layer-N-type thermoelectric element layer pairs can be suppressed, an improvement in yield in the production can be expected.

Furthermore, as for the thermoelectric conversion device obtained by the method of producing a thermoelectric conversion device of the present invention, thinning (size reduction and light weight) can be realized.

By forming the thermoelectric conversion device obtained by the aforementioned method of producing a thermoelectric conversion device into a module, it may be thought to be applied to use of power generation for electrically converting exhaust heat from a factory or various combustion furnaces, such as a waste combustion furnace and a cement combustion furnace, exhaust heat of combustion gas of an automobile, and exhaust heat of electronic equipment. As for the cooling use, in the field of electronic equipment, it may be thought to be applied to use for temperature control of various sensors, for example, a CPU (Central Processing Unit) used for a smartphone, various computers, and the like, image sensors, such as a CMOS (Complementary Metal Oxide Semiconductor Image Sensor) and a CCD (Charge Coupled Device), and MEMS (Micro Electro Mechanical Systems) and other light receiving elements.

REFERENCE SIGNS LIST

1: Substrate
2: Pattern frame
2': Stainless steel
3s: Aperture
3d: Opening depth (pattern frame thickness)
3: Opening
4a: N-type thermoelectric element layer
4b: P-type thermoelectric element layer
11a: Substrate
11b: Counter substrate
12a: Electrode
12b: Counter electrode
14a: N-Type thermoelectric element layer
14b: P-Type thermoelectric element layer

The invention claimed is:

1. A method of producing a thermoelectric conversion device including a thermoelectric element layer formed of a thermoelectric semiconductor composition containing a thermoelectric semiconductor material on a substrate, the method comprising:
providing a pattern frame having openings on a substrate;
filling the thermoelectric semiconductor composition in the openings;
drying the thermoelectric semiconductor composition filled in the openings, to form a thermoelectric element layer;
releasing the pattern frame from the substrate and the thermoelectric element layer; and
subjecting the thermoelectric element layer to an annealing treatment at a temperature of 250 to 600° C.

2. The method of producing a thermoelectric conversion device according to claim 1, wherein the substrate is a polyimide film, a polyamide film, a polyether imide film, a polyaramid film, or a polyamide-imide film.

3. The method of producing a thermoelectric conversion device according to claim 1, wherein the pattern frame includes stainless steel, copper, aluminum, or iron.

4. The method of producing a thermoelectric conversion device according to claim 1, wherein the pattern frame includes a ferromagnetic body.

5. The method of producing a thermoelectric conversion device according to claim 1, wherein a release layer is included on a wall surface of the openings of the pattern frame.

6. The method of producing a thermoelectric conversion device according to claim 1, comprising fixing the pattern frame on the substrate by using a magnet.

7. The method of producing a thermoelectric conversion device according to claim 1, wherein the thermoelectric semiconductor material is a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material.

8. The method of producing a thermoelectric conversion device according to claim 1, wherein the shape of the openings is at least one selected from the group consisting of an irregular shape, a polyhedral shape, a truncated cone shape, a truncated elliptical cone shape, a columnar shape, and an elliptic columnar shape.

9. The method of producing a thermoelectric conversion device according to claim 1, wherein the thermoelectric semiconductor composition further contains a heat-resistant resin and an ionic liquid and/or an inorganic ionic compound.

10. The method of producing a thermoelectric conversion device according to claim 9, wherein the heat-resistant resin is a polyimide resin, a polyamide resin, a polyamide-imide resin, or an epoxy resin.

11. A method of producing a thermoelectric conversion device including a thermoelectric element layer formed of a thermoelectric semiconductor composition containing a thermoelectric semiconductor material on a substrate, the method comprising:
providing a pattern frame having openings on a substrate;
filling the thermoelectric semiconductor composition in the openings;

drying the thermoelectric semiconductor composition filled in the openings, to form a thermoelectric element layer; and releasing the pattern frame from the substrate and the thermoelectric element layer, wherein the thermoelectric semiconductor material is a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material.

12. The method of producing a thermoelectric conversion device according to claim 11, wherein the substrate is a polyimide film, a polyamide film, a polyether imide film, a polyaramid film, or a polyamide-imide film.

13. The method of producing a thermoelectric conversion device according to claim 11, wherein the pattern frame includes stainless steel, copper, aluminum, or iron.

14. The method of producing a thermoelectric conversion device according to claim 11, wherein the pattern frame includes a ferromagnetic body.

15. The method of producing a thermoelectric conversion device according to claim 11, wherein a release layer is included on a wall surface of the openings of the pattern frame.

16. The method of producing a thermoelectric conversion device according to claim 11, comprising fixing the pattern frame on the substrate by using a magnet.

17. The method of producing a thermoelectric conversion device according to claim 11, wherein the thermoelectric semiconductor composition further contains a heat-resistant resin and an ionic liquid and/or an inorganic ionic compound.

18. The method of producing a thermoelectric conversion device according to claim 17, wherein the heat-resistant resin is a polyimide resin, a polyamide resin, a polyamide-imide resin, or an epoxy resin.

19. The method of producing a thermoelectric conversion device according to claim 11, further comprising subjecting the thermoelectric element layer to an annealing treatment.

20. The method of producing a thermoelectric conversion device according to claim 19, further comprising releasing chips constituting the thermoelectric element layer after the annealing treatment.

* * * * *